United States Patent [19]

Åkerlund et al.

[11] Patent Number: 4,638,301
[45] Date of Patent: Jan. 20, 1987

[54] STRAY PULSE ELIMINATING DEVICE

[75] Inventors: Mats P. Åkerlund; Ture J. Strömbäck, both of Järfälla, Sweden

[73] Assignee: U.S. Philips Corporation, New York, N.Y.

[21] Appl. No.: 638,135

[22] Filed: Aug. 6, 1984

[30] Foreign Application Priority Data

Aug. 5, 1983 [SE] Sweden ............................. 8304290

[51] Int. Cl.[4] ........................................... H03K 5/159
[52] U.S. Cl. .............................. 340/347 CC; 307/353; 328/151
[58] Field of Search ................. 340/347 DA, 347 SH; 307/352, 353, 544, 246, 263; 363/126; 328/151

[56] References Cited

U.S. PATENT DOCUMENTS 3,851,260  11/1974  Colin ................................. 307/353
4,132,908   6/1979  Hughes ......................... 340/347 SH Primary Examiner—L. T. Hix
Assistant Examiner—David M. Gray
Attorney, Agent, or Firm—Thomas A. Briody; Jack Oisher; William J. Streeter

[57] ABSTRACT

The invention relates to a device for eliminating stray pulses occuring on the output of a digital-to-analogue converter DA. The pulses may be caused by, for example, insufficient synchronism in the input data bits and may be predicted in time. According to the invention an inductor L is arranged between the output of the digital-to-analogue converter and a following circuit F, for example a deflecting amplifier for random scan displays, and a switch S2 is arranged between the said output and ground which switch when a pulse is predicted to occur shortcircuits the output of the digital-to-analogue converter to ground. Hereby an eliminating device of simple and cheap construction is obtained operating at high frequencies.

5 Claims, 4 Drawing Figures

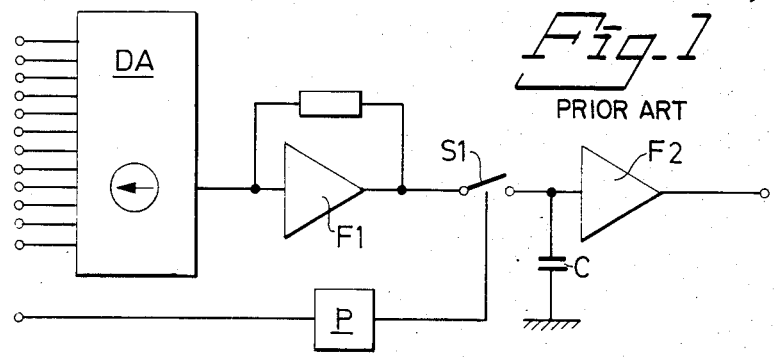
Fig_1 PRIOR ART
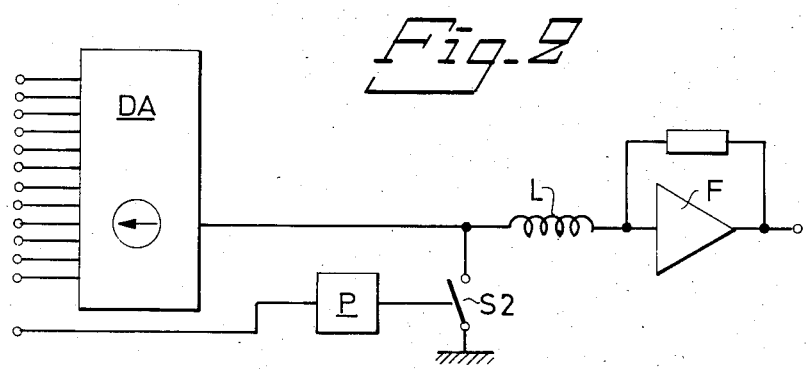
Fig_2
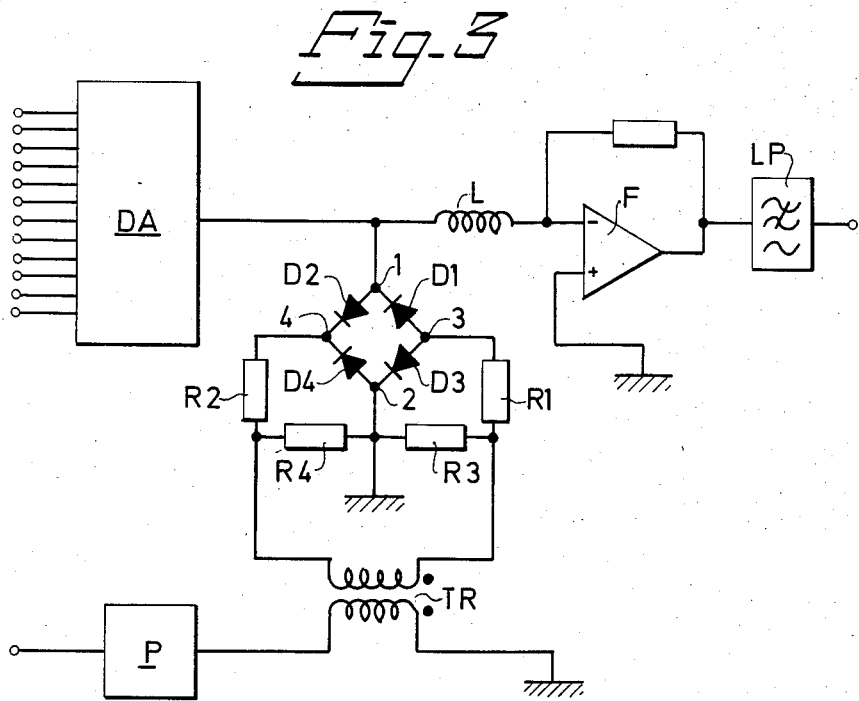
Fig_3

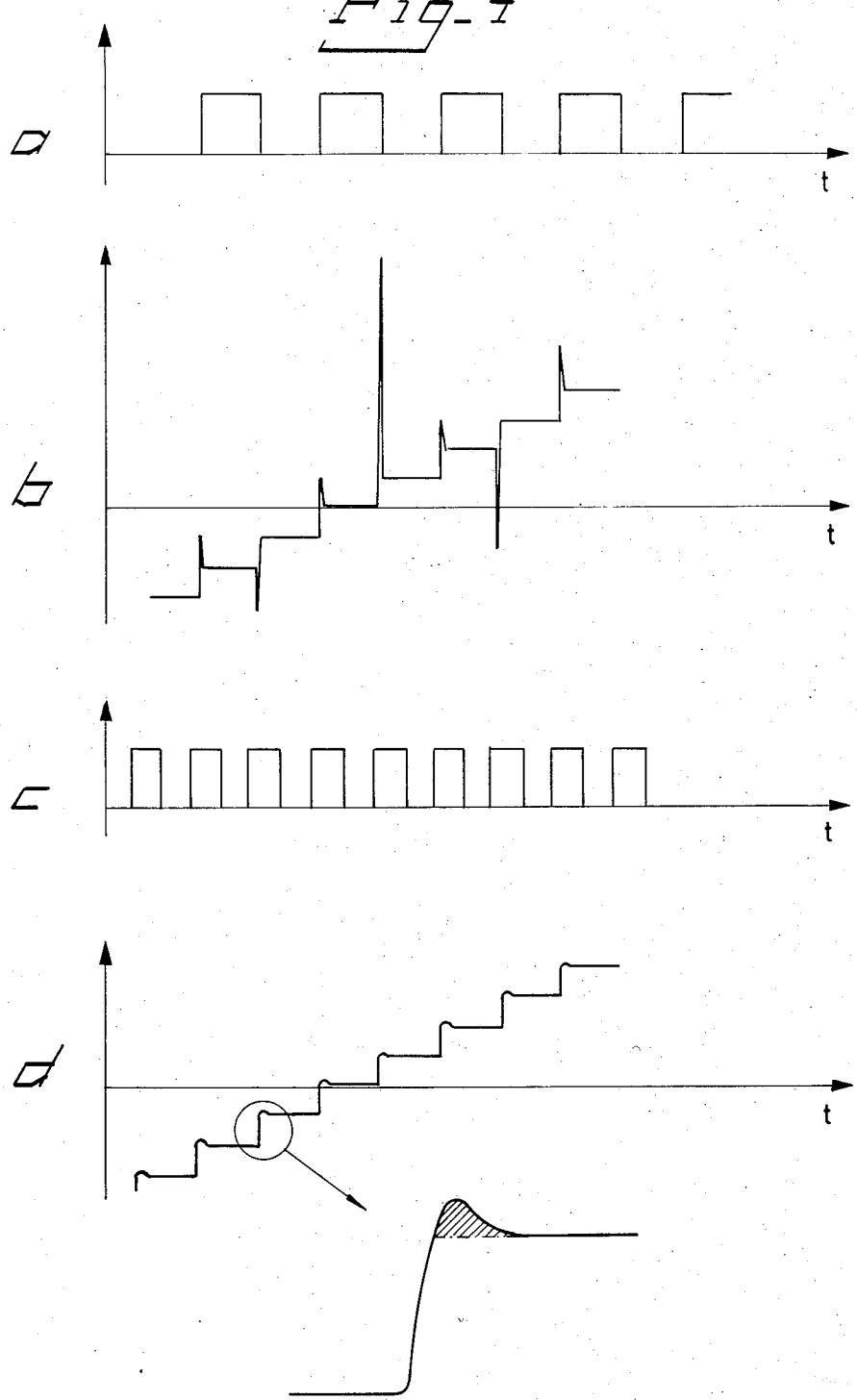

STRAY PULSE ELIMINATING DEVICE

BACKGROUND OF THE INVENTION

The present invention relates to a device for eliminating stray pulses occurring at the output of a digital-to-analogue converter and which may be caused by for example shortcomings, such as insufficient synchronism, of input data bits. A possible stray pulse in the digital-to-analogue converter is prevented by means of the eliminating device from reaching a following circuit during a time period in which the pulse is predicted to occur.

The need for an eliminating device of the kind set forth in the opening paragraph is well known to people working with random scan displays and similar devices where the signals for the deflection amplifiers are generated digitally and converted to vector signals in a digital-to-analogue converter (D/A converter).

The stray pulse may be a current or voltage pulse occurring at the output of the D/A converter and may be caused, for example, by the input data bits not being perfectly synchronous (internally and/or externally). The stray pulse is often measured in terms of a charge. Since the stray pulses are only predictable in time and not in charge they cannot in general be filtered out by using linear filters.

The method commonly used involves the blocking of the signal supplied by the D/A converter during the time period in which a stray pulse is predicted to occur so that the signal containing stray pulses is substituted by a high frequency pulse train with a fairly constant charge which is easily filtered out, whereby only a direct current component remains. It is possible to filter out the high frequency pulse train because the clock frequency of the D/A converter is much higher than the upper limiting frequency of systems, such as deflection systems coupled through the output of the eliminating device. It is essential that the signal converted in the D/A converter do not pass through any devices which can only pass low frequency signals before it reaches the eliminating device, because such a device prolongs the duration of the stray pulses.

A previously known device for eliminating stray pulses comprises a capacitor, an analogue switch and a buffer amplifier. When the occurrence of a stray pulse is predicted the switch disconnects the connection between the D/A converter and the capacitor. The capacitor stores the prevailing signal across the capacitor at the moment of disconnection and when the switch is reclosed the capacitor is rapidly charged to the new signal value given by the D/A converter.

The known device has several disadvantages. Most of the D/A converters for high frequencies have current output. The known device therefore has to be completed by an amplifier at the input converting the current output of the D/A converter to a voltage output suitable for the stray pulse eliminating device according to the above. Consequently, the amplifier, having a limited bandwidth introduces an undesired prolongation of the duration of the stray pulses.

SUMMARY OF THE INVENTION

An object of the invention is to obtain a device which allows the output of the D/A converter to be directly coupled to the input of the eliminating device without any intermediate amplifier distorting the shape of the stray pulses.

A further object of the invention is to obtain a simple and inexpensive eliminating device operable at high frequencies.

The objects of the invention are obtained by means of a device which comprises an inductor arranged between the output of the D/A converter and the following circuit, and a switch connected between the output of the D/A converter and a reference level. The switch short-circuits the output of the D/A converter to the reference level for the time period during which a stray pulse is predicted to occur. The following circuit is preferably an operational amplifier with negative feedback resulting in a low ohmic summing point.

Embodiments of the invention will now be described in more detail by way of example with reference to the accompanying drawings.

BRIEF DESCRIPTION OF THE FIGURES

FIG. 1 shows schematically a previously known stray pulse eliminating device,

FIG. 2 shows schematically a stray pulse eliminating device according to the invention, FIG. 3 shows in more detail another embodiment of a stray pulse eliminating device according to the invention and FIGS. 4a–d show time diagrams for a device according to the invention.

DESCRIPTION OF THE PREFERRED EMBODIMENTS

According to the known device shown in FIG. 1 an amplifier F1 is connected to the output of a D/A converter DA having current output. The output of the amplifier F1 is connected to the input of a second amplifier F2 via a switch S1. Furthermore, the input of the second amplifier F2 is connected to a reference level, in this embodiment ground, via a capacitor C. The switch S1 is controlled by a prediction circuit P which predicts the time of the occurrence of a stray pulse. When a stray pulse is expected to occur the prediction circuit P ensures that the switch S1 disconnects the connection between the amplifiers F1, F2. The signal across the capacitor C at the time of disconnection then remains stored across the capacitor. When the expected stray pulse is assumed to have ceased the switch S1 is reclosed and the capacitor rapidly is charged to a signal value which now is present on the output of the first amplifier F1.

Referring to FIG. 2 a device according to the invention comprises an inductor L, such as a choke coil, connected between the output of the D/A converter and the input of an operational amplifier F and a switch S2 connected between the output of the D/A converter DA and ground. The switch S2 is controlled by a prediction circuit P which predicts the time of the occurrence of a stray pulse. Just before the pulse is expected to occur the prediction circuit P ensures that the switch S2 is closed and then is maintained closed for a period containing the instant of the occurrence of the expected stray pulse. The current from the output of the D/A converter DA then remains stored in the inductor L and the charge of the stray pulse is shortcircuited to ground. Because the inductor L is connected between the switch S2 and the summing point of the operational amplifier F the voltage across the inductor L is practically zero. Accordingly, this does not give rise to any significant current change during the period when the switch S2 is closed. When the switch S2 is reopened the current at the output of the D/A converter DA is supplied to the inductor L which rapidly changes its current to the new value.

In the embodiment shown in FIG. 3 the switch is constituted by a diode and resistor coupling consisting of four diodes and four resistors. The diodes which ought to be of a rapid switching type (for example hot carrier diodes) are in a bridge coupling consisting of two parallel coupling paths with two unidirected diodes D1, D2 and D3, D4, respectively, in each of the coupling paths. The junction 1 between the diodes D1, D2 in one of the coupling paths is connected to the output of the D/A converter DA and the junction 2 between the diodes D3, D4 in the other coupling path is connected to ground. One of the common ends 3 of the coupling paths is connected to one terminal of the output of a high-frequency transformer TR via a resistor R1 and the other common end 4 of the coupling paths is connected to the other terminal of the output of the highfrequency transformer TR via a resistor R2. Furthermore, a resistor R3 is connected between a terminal of the transformer TR and ground and a further resistor R4 is connected between the other terminal of the transformer TR and ground.

The switch S2 in the form of a diode and resistor bridge is closed by means of a pulse signal at the output of a driver, for example a TTL gate, being supplied to the resistor and the diode coupling via the high-frequency transformer TR. THe signal pulls equal currents through the two coupling paths so that the junctions 1, 2 between the diodes D1, D2 and D3, D4, respectively, in the coupling paths assume substantially the same potential, that is the potential of ground.

In FIG. 3 a lowpass filter LP is shown at the output of the amplifier F. The filter prevents high frequency signals from passing so that the output of the filter becomes a constant direct current. Normally, the low-pass filter function is obtained by a system coupled to the output of the amplifier, the system being in the form of, for example, a deflection system having per se a limited band width and hence an upper limiting frequency.

In FIGS. 4a-d time diagrams of the device according to the invention are shown. The digital input signal of the D/A converter is assumed having been generated by a BCD counter clocked with a constant frequency so that the ideal output current of the D/A converter thus should have an evenly ascending stair-case shape. FIG. 4a shows the clock pulses of the counter. FIG. 4b shows the D/A converter output current which as shown may have both positive and negative stray pulses of varying amplitudes which may result from improper synchronism of the input digital signal to the D/A converter. FIG. 4c indicates the time intervals during which stray pulses are expected to occur, that is the time intervals during which, according to the invention, the switch S2 is maintained closed.

FIG. 4d shows the actual current through the inductor L at the output of the D/A converter, the upper front edge of a stairstep being shown in an enlarged scale. The region of the enlarging having oblique strokes has a substantial constant charge content for each stairstep. Accordingly, the current curve deviates somewhat from the ideal evenly ascending staircase due to transients occurring when the switch S2 is closed, but these disturbances have as has already been pointed out a substantially constant charge content.

Thus there is described with respect to one embodiment apparatus for eliminating stray pulses from a D/A converter. Those skilled in the art will recognize yet other embodiments described more particularly by the claims that follow.

What is claimed is:

1. A device for eliminating stray pulses occurring at the output of a digital-to-analogue converter by preventing said stray pulses from reaching a connected circuit for a time period during which the pulse is predicted to occur, wherein said device comprises an inductor serially connected between the output of the digital-to-analogue converter and the connected circuit and a switch connected between the output of the digital-to-analogue converter and a reference level, and means for operating said switch to short-circuit the output of the digital-to-analogue converter to the reference level for the time period during which a stray pulse is predicted to occur.

2. A device according to claim 1, wherein said device further comprises a prediction circuit for determining the instants of expected occurrence of stray pulses and controlling opening and closing of said switch at said determined instants of expected occurrence.

3. A device according to claims 1 or 2 wherein said inductor is a choke coil.

4. A device according to claim 3 wherein said switch comprises a diode coupling having two parallel coupling paths, said paths connected at each end thereof to form first and second common junctions, each path having two unidirected diodes connected in series, the junction between the diodes in one coupling path being connected to the output of the digital-to-analogue converter and the junction between the diodes in the other coupling path being connected to the reference potential, and a resistance network consisting of a first resistor connected between one input terminal of the switch and a common junction of the coupling paths, a second resistor connected between the other input terminal of the switch and a second common junction of the coupling paths, a third resistor connected between the first input terminal and the reference potential and a fourth resistor connected between the second input terminal and the reference potential.

5. A device according to claim 4, wherein a pulse signal applied to the first and second input terminals of the switch is coupled via a transformer.

* * * * *